US005541129A

United States Patent [19]

Tsunoda

[11] Patent Number: 5,541,129
[45] Date of Patent: Jul. 30, 1996

[54] METHOD OF MAKING NON-VOLATILE MEMORY DEVICE

[75] Inventor: Hiroaki Tsunoda, Kanagawa-ken, Japan

[73] Assignee: Kabushiki Kaisha Toshiba, Kawasaki, Japan

[21] Appl. No.: 290,073

[22] Filed: Aug. 15, 1994

Related U.S. Application Data

[62] Division of Ser. No. 119,525, Sep. 13, 1993, abandoned, which is a continuation of Ser. No. 575,870, Aug. 31, 1990, abandoned.

[30] Foreign Application Priority Data

Aug. 31, 1989 [JP] Japan ..................... 1-225303

[51] Int. Cl.⁶ ........................................ H01L 21/8247
[52] U.S. Cl. ..................... 437/43; 437/978; 437/238; 437/241
[58] Field of Search ................ 437/43, 233, 241, 437/978, 238

[56] References Cited

U.S. PATENT DOCUMENTS

| | | | |
|---|---|---|---|
| 4,115,914 | 9/1978 | Harari. | |
| 4,385,308 | 5/1983 | Uchida | 257/326 |
| 4,630,086 | 12/1986 | Sato et al. | 357/23.5 |
| 5,008,721 | 4/1991 | Gill et al. | 357/23.5 |
| 5,017,979 | 5/1991 | Fujii et al. | 257/321 |
| 5,063,423 | 11/1991 | Fujii et al. | 357/23.5 |
| 5,138,410 | 8/1992 | Takebuchi. | |

FOREIGN PATENT DOCUMENTS 59-66171  4/1984  Japan ..................... 257/321

*Primary Examiner*—George Fourson
*Assistant Examiner*—Richard A. Booth
*Attorney, Agent, or Firm*—Oblon, Spivak, McClelland, Maier & Neustadt, P.C.

[57] ABSTRACT

A semiconductor memory device such as an EEPROM having an insulation layer with a dielectric constant greater than that of $SiO_2$ formed beneath a floating gate on or below a tunnel oxide layer where the passage of electrons is enabled by means of tunnel effect in order to increase the dielectric breakdown voltage of the tunnel oxide layer. The semiconductor memory device is made by a method in which, for example, a thin $Si_3N_4$ layer is formed on a thin $SiO_2$ tunnel oxide layer or a substrate, and the layered structure is patterned to leave only a tunnel part. Then a $SiO_2$ gate insulation layer is formed over the substrate and the tunnel part, followed by formation of a floating gate on the $SiO_2$ gate insulation layer and diffusion of impurities into the floating gate. The $Si_3N_4$ portion of the tunnel part prevents diffused impurities from reaching the $SiO_2$ tunnel oxide of the tunnel part or the substrate. Further, patterning of the tunnel part before formation of the $SiO_2$ gate insulation layer avoids contamination of the $SiO_2$ gate insulation layer. Thus, the dielectric breakdown voltage of the $SiO_2$ tunnel oxide of the tunnel part and the $SiO_2$ gate insulation layer is increased.

2 Claims, 3 Drawing Sheets

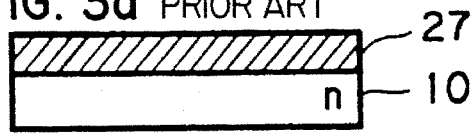
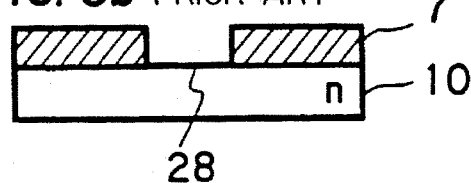
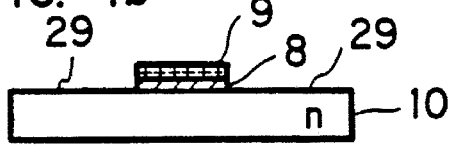
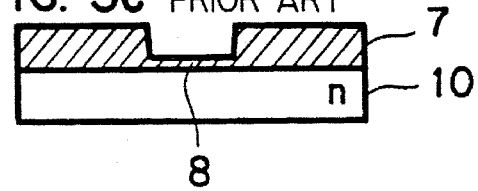
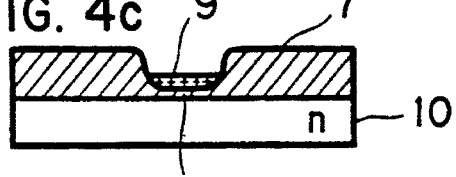
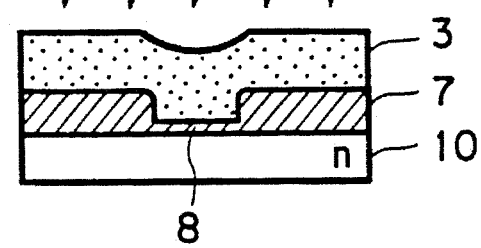
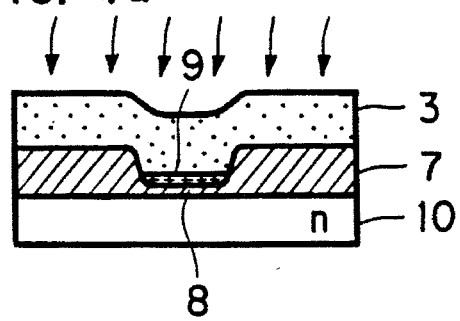
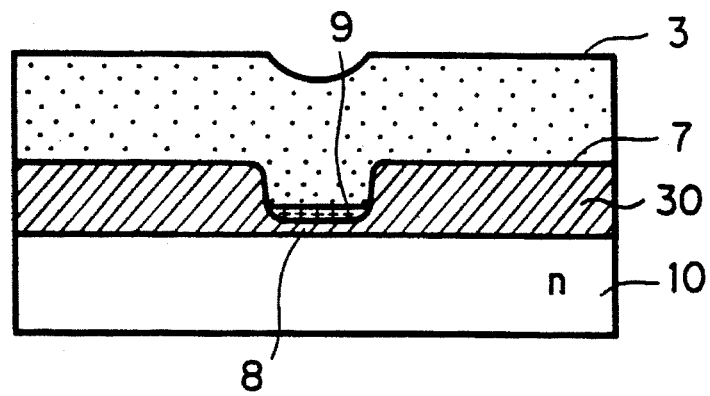

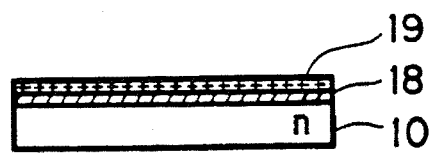
FIG. 6a
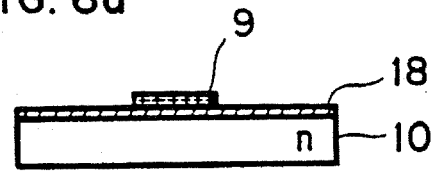
FIG. 6b
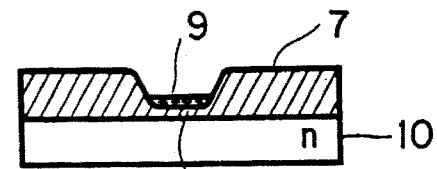
FIG. 6c
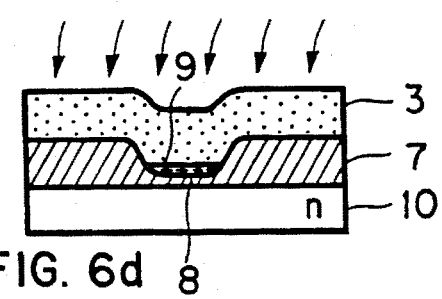
FIG. 6d
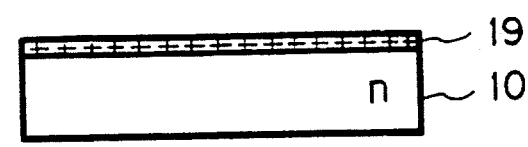
FIG. 7a
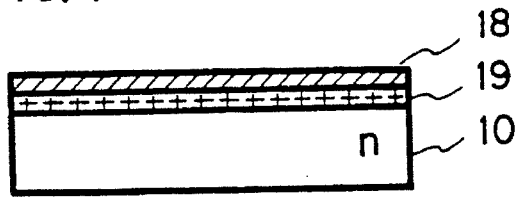
FIG. 7b
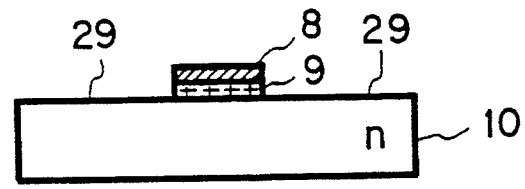
FIG. 7c
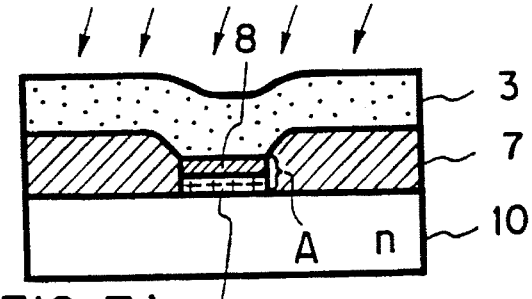
FIG. 7d
FIG. 8a
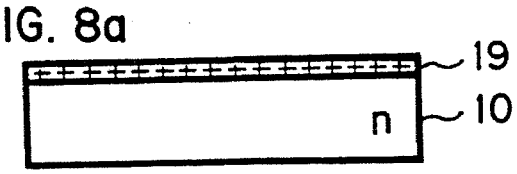
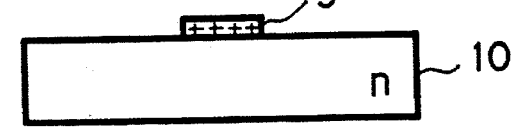
FIG. 8b
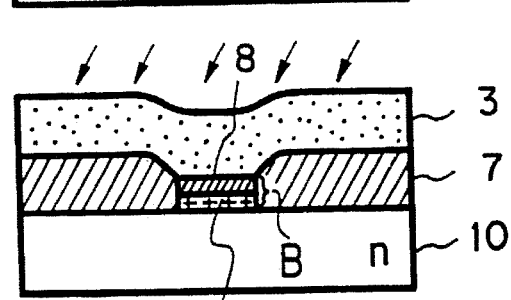
FIG. 8c

METHOD OF MAKING NON-VOLATILE MEMORY DEVICE

This application is a Division of application Ser. No. 08/119,525 filed on Sep. 13, 1993, now abandoned, which was a Continuation of application Ser. No. 07/575,870, filed on Aug. 31, 1990, now abandoned.

FIELD OF THE INVENTION

This invention relates to a semiconductor memory device and a method of manufacturing it, in particular, a non-volatile memory, for example, an EEPROM into which data can be electrically erased.

DESCRIPTION OF BACKGROUND

The conventional EEPROM generally has an element structure as shown in the cross-sectional view shown in FIG. 1. A drain region 1 and a source region 2 of a N-type impurity region are formed in a P-type silicon substrate 10, and a N-type impurity region 6 is formed between each of the regions 1, 2. Further, a control gate 4 is layered above the N-type impurity region 6 through a silicon oxide layer 7, and also, a floating gate 3 of a polysilicon layer is formed in the silicon oxide layer 7. This silicon oxide layer $SiO_2$ (silicon dioxide) 7 includes a tunnel insulation layer 8 thinner than the rest of the layer 7, so that electrons formed in the N-type impurity region 6 are caused to be injected into the floating gate 3 where the electrons are accumulated, and to be drawn from the layer 3 via the tunnel insulation layer 8 by utilizing the tunnel effect. Further, a select gate 5 is layered on the silicon oxide layer 7 between the N-type impurity region 6 and drain region 1.

FIG. 2 shows a partial expanded structure, which is enclosed by the dotted line A shown in FIG. 1, including the tunnel insulation layer 8 and part of the floating gate 3. The structure shown in FIG. 2 is formed by a method explained below in connection with FIGS. 3(a)–3(d).

As shown in FIG. 3(a), a silicon oxide layer 27 is layered on the entire surface of the silicon substrate 10 having N-type impurity 6, and part of the silicon oxide layer 27 is removed by a photolithographic process to expose a surface region 28 of part of the silicon substrate 10, in order subsequently to form the tunnel insulation layer 8 (FIG. 3(b)). Further, the tunnel insulation 8 is formed on the surface of the exposed substrate (FIG. 3(c)), and the polysilicon layer 3 is layered on the silicon layers 7 and 8. A phosphorus impurity is diffused in the polysilicon layer 3 by being placed in an atmosphere of POC13, in order to improve the conductivity of the polysilicon layer 3 (FIG. 3(d)).

However this semiconductor memory device has the following drawbacks.

As shown in FIG. 3(b), when part of the silicon oxide layer 27 is removed by the photolithographic process and is exposed in order to subsequently form the tunnel insulation layer 8, after the silicon oxide layer 27 is layered on the entire surface of the silicon substrate 10, the surface 28 of the exposed substrate 10 is contaminated, because a photoresist is removed by a solution including $H_2SO_4$ and $H_2O_2$ with the surface exposed. As a result, the dielectric breakdown voltage of the tunnel insulation layer 8 is remarkably lowered. To prevent the above drawbacks, a process of dipping into a diluted HF solution is carried out before the tunnel insulation layer 8 is formed on the exposed surface 28 of the substrate 10. Although the dielectric breakdown voltage of the tunnel insulation layer 8 is increased, that of the oxide layer 7 is lowered because the silicon oxide layer 7 itself is exposed to diluted HF solution. Also, in the process step of FIG. 3(d), the phosphorus is diffused in the polysilicon layer 3. But the dielectric breakdown voltage of the tunnel insulation layer 8 too is lowered because phosphorus is also diffused into the insulation layer 8.

With regard to a method of examination TDDB (Time Dependent Dielectric Breakdown) into the dielectric breakdown voltage of the tunnel insulation layer 8, there is the method of applying a constant current to the tunnel insulation layer 8. By this method, the rate of defective products generated after the passage of a certain time is examined. And, with regard to a method of examination into the dielectric breakdown voltage of the silicon oxide layer 7, there is the method of applying a voltage between the select gate 5 and the silicon substrate 10 while the part of the silicon oxide layer 7 between them is destroyed. By this method, the rate of products destroyed by an applied voltage of 20 V or less is examined. However, it is not possible to obtain good results by performing both examinations due to the above drawbacks.

SUMMARY OF THE INVENTION

Accordingly, it is an object of this invention to provide a novel semiconductor memory device and method of manufacturing it, which is able to increase the dielectric breakdown voltage of a tunnel insulation layer and a gate oxide layer under a select gate.

The above and other objects are achieved according to the invention, by providing a semiconductor memory device including a semiconductor substrate of a first conductivity type; a first insulation layer which includes a thick part and a tunnel insulation part thinner than the thick part and which enables electrons formed in the substrate to pass through the tunnel insulation part; a second insulation layer formed on the tunnel insulation part; a polysilicon layer formed on the first insulation layer and the second insulation layer and having therein diffused an impurity for improving the conductivity thereof; and wherein the second insulation layer is made of a material which blocks impurities diffused into the polysilicon layer from reaching the tunnel insulation layer.

Further according to the present invention there is provided a method of manufacturing a semiconductor memory device including the steps of forming a first insulation layer on a semiconductor substrate; forming a second insulation layer on the first insulation layer; removing the first insulation layer except for a tunnel insulation part through which in the finished device electrons formed in the substrate are enabled to pass through; forming a third insulation layer having a thickness thicker than the thickness of the first insulation layer; and forming a polysilicon layer on the third and second insulation layer by a photolithographic process. As a result, the dielectric breakdown voltage of the tunnel insulation layer is increased because the surface of the substrate adjacent the tunnel part is not exposed. Further, it is unnecessary to use a photolithographic process to remove the silicon oxide layer of the tunnel part, as a result carrying out the step of forming the second insulating layer after the step of forming the first insulation layer. Further the dielectric breakdown voltage of the tunnel insulation layer is increased because of the provision of the second insulation layer which prevents the impurity of the polysilicon migrating into the tunnel insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3(a) to 3(d) are cross-sectional views illustrating steps in a process of manufacturing the device shown in FIG. 1;

FIGS. 4(a) to 4(d) are cross-sectional views illustrating steps in a process of manufacturing a semiconductor memory device according to the invention;

FIG. 5 is a cross-sectional view of a semiconductor memory device completed by using the process of the present invention;

FIGS. 6(a) to 6(d) are cross-sectional views illustrating steps of an other process of manufacturing a semiconductor memory device according to the present invention;

FIGS. 7(a) to 7(d) are cross-sectional views of another process of manufacturing a semiconductor memory device according to the present invention; and FIGS. 8(a) to 8(c) are cross-sectional views illustrating steps of yet another process of manufacturing a semiconductor memory device according to the present invention.

DESCRIPTION OF THE PREFERRED EMBODIMENTS

Figure 1:
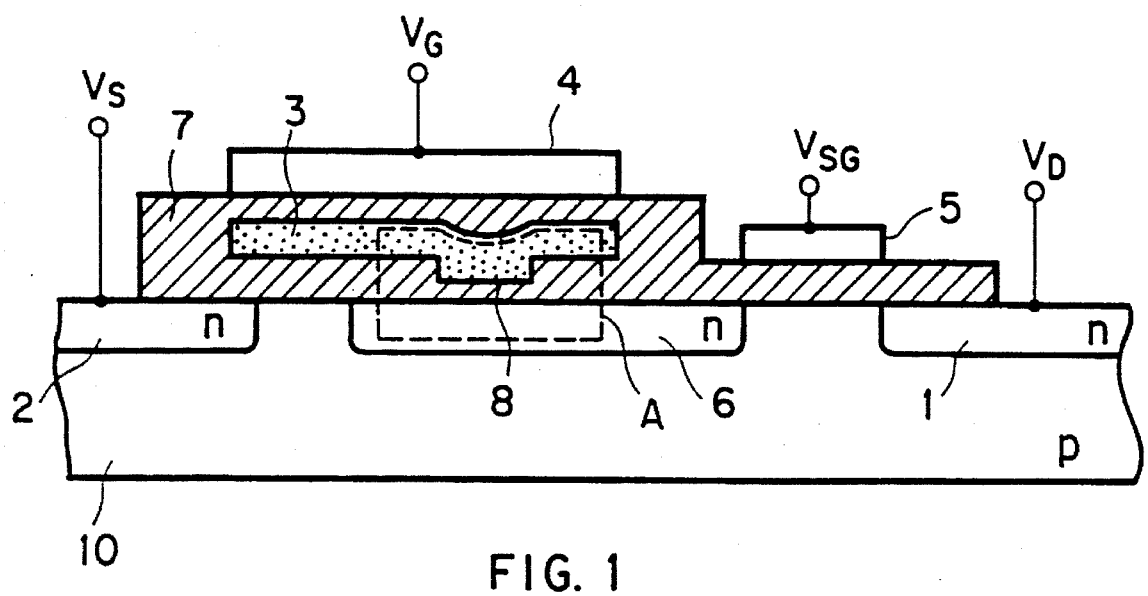
FIG. 1 is a cross-sectional view of a portion of a prior art semiconductor memory device.
Figure 2:
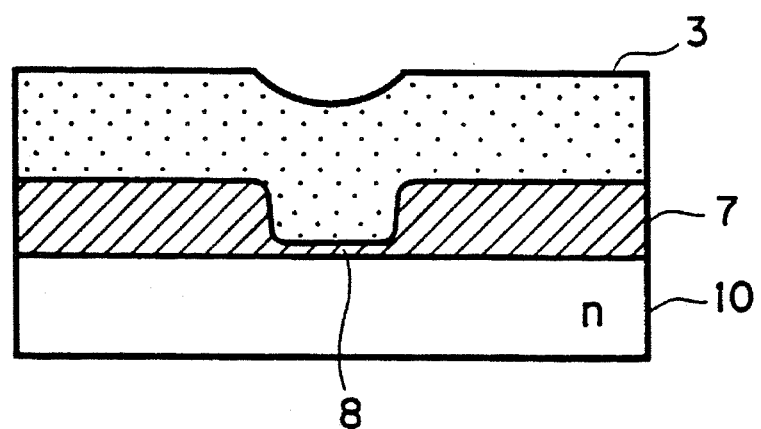
FIG. 2 is an enlarged illustration of portion A of the device shown in FIG. 1.

Referring now to the drawings, wherein like reference numerals designate identical or corresponding parts throughout the several views, and more particularly to FIGS. 4(a)–4(d) thereof, there is shown cross-sectional views for explaining steps of a process of the present invention. In the prior art process of FIGS. 3(a)–3(d), the thin tunnel oxide layer 8 is formed after formation of the thick silicon oxide layer 27. However, according to the present invention, the order of the steps on the above process of manufacturing is reversed.

As shown in FIG. 4(a), a silicon oxide layer 18 having the same thickness 90 Angstroms (Å) of a tunnel oxide layer 8 is layered on a surface where a N-type impurity region is formed in a P-type silicon substrate 10, by being placed in the atmosphere of $O_2$ including HCl at about 800° C. A second $Si_3N_4$ insulation layer 19 is layered on the silicon oxide layer 18 by a chemical vapor deposition (CVD) process. The silicon oxide layer 18 and the $Si_3N_4$ layer 19 are removed except for a tunnel portion 8, 9 by means of a photolithographic process, and accordingly the surface 29 of the substrate 10, except for the tunnel $SiO_2$ (silicon dioxide) 8 and $Si_3N_4$ (silicon nitride layer) 9, is exposed (FIG. 4(b)).

A next step involves fabrication of an insulation layer 7 which is 430 Å thickness on the surface 29. This insulation layer 7 is fabricated except on the tunnel region 8, 9, by being placed in an atmosphere of $O_2$ including HCl at about 900° C. (FIG. 4(c)). Thereafter, a floating gate of a polysilicon layer 3 of 4000 Å thickness is layered thereon by a chemical vapor deposition (CVD) process. Further, this structure is then placed in an atmosphere of $POCl_3$ at 900° C. to diffuse phosphorus in the polysilicon layer 3 (FIG. 4(d)). This diffusion of phosphorus improves the conductivity thereof.

As a result, the semiconductor memory device (FIG. 5) fabricated by the above process has a tunnel $Si_3N_4$ layer 9 which prevents phosphorus diffused into the polysilicon layer 3 from diffusing into the tunnel insulation layer 8.

FIGS. 6(a)–6(d) show the steps of another method of the present invention. As shown in FIG. 6(a), after the silicon oxide layer 18 having the same 90 Å thickness of the tunnel oxide layer 8 is layered on a surface of a N-type impurity region formed in a P-type silicon substrate 10 by being placed in an atmosphere of $O_2$ including HCl at about 800° C., a second insulation layer 19 of $Si_3N_4$ is layered on the silicon oxide layer 18 by a chemical vapor deposition (CVD) process. In the above embodiment of FIG. 4(b), both of the silicon oxide layer 18 and the $Si_3N_4$ layer 19 are removed except for the tunnel portion 8, 9. However, in this second embodiment, only the $Si_3N_4$ layer 19 is removed except for the tunnel part 9 by a photolithographic process. In other words, the silicon oxide layer 18 is exposed except underneath the tunnel $Si_3N_4$ layer part 9.

Thereafter, the same steps of FIG. 4(c) and FIG. 4(d) are carried out. Namely, the insulation layer 7 of 430 Å thickness is fabricated on the silicon oxide layer 18, except for the part of the tunnel silicon oxide layer 8, by being placed in an atmosphere of $O_2$ including HCl at about 900° C. (FIG. 6(c)), and the polysilicon layer 3 of 4000 Å thickness is layered on the tunnel $Si_3N_4$ layer 9 and the insulation layer 7 by a CVD process. Thereafter, phosphorus is diffused into the polysilicon layer 7 (FIG. 6(d)).

FIGS. 7(a)–7(d) show another embodiment of the method of the present invention. As shown in FIG. 7(a), a $Si_3N_4$ layer 19 having a 70 Å thickness is layered on the semiconductor substrate 10 by placement of the substrate 10 in an atmosphere of $NH_4$ at about 1000° C., i.e., by a CVD process.

Second, as shown in FIG. 7(b), a silicon oxide layer 18 having a 20 Å thickness is layered on the $Si_3N_4$ 19 by being placed in an atmosphere of $O_2$ including HCl at about 900° C.

Third, as shown in FIG. 7(c), the $Si_3N_4$ layer 19 and the silicon oxide layer 18 are removed except for the tunnel insulation part 8, 9 by a photolithographic process. Finally, as shown in FIG. 7(d), the insulation layer 7 having a 430 Å thickness is formed on the exposed semiconductor substrate 29 by being placed in an atmosphere of $O_2$ including HCl at about 900° C. Then, the silicon oxide layer 8 is not again oxidized because it has already been oxidized. Thereafter, polysilicon layer 3 serving as a floating gate, having a 4000 Å thickness, is layered on the insulation layer 7 and the silicon oxide layer 8 by a conventional CVD process.

FIGS. 8(a)–8(c) show a further embodiment of the present invention. As shown in FIG. 8(a), $Si_3N_4$ layer 19 having a thickness of 70 Å is layered on the semiconductor substrate 10 by placement of the substrate in an atmosphere of $NH_4$ at about 1000° C. i.e. by a CVD process.

Second, as shown in FIG. 8(b), the $Si_3N_4$ layer 19 is removed except for the tunnel insulation part 9 by a photolithographic process. Third, as shown in FIG. 8(c), the insulation layer 7 having a 430 Å thickness is formed on the exposed semiconductor substrate 29 and the remaining $Si_3N_4$ layer 9 by being placed in an atmosphere of $O_2$ including HCl at about 900° C. Thus, the remaining $Si_3N_4$ layer 9 is a little oxidized (numeral 8 shows this $SiO_2$ layer). Then, polysilicon layer 3 serving as a floating gate and having 4000 Å thickness is layered on the insulation layer 7 and the thin $SiO_2$ layer 8 by a conventional CVD process. Finally, phosphorus is diffused into the polysilicon layer 3.

These embodiments of the present invention give the following effects. In FIG. 3b of the prior art, the diluted HF (Hydro-Fluoric acid) process is carried out to prevent the surface 28 of the substrate 10 from being polluted. As a result, the insulation layer 7 is polluted, and a dielectric breakdown voltage of the insulation layer 7 between the select gate 5 and the silicon substrate 10 is lowered. To solve the above problem, in the above embodiments, the surface is not exposed because the tunnel oxide layer 8 or the tunnel $Si_3N_4$ layer 9 is formed in advance. Therefore, the dielectric breakdown voltage of the insulation layer 7 is increased because the surface 28 is not polluted and diluted HF naturally is unnecessary. Further, the $Si_3N_4$ layer 9 formed on the tunnel oxide layer 8 (shown in FIG. 5) prevents diffusion of phosphorus from the polysilicon layer 3 into the tunnel oxide layer 8. Therefore, the dielectric breakdown voltage of the insulation layer 8 is increased.

Accordingly, the EEPROM formed by the method of this invention improves considerably the dielectric breakdown voltage of both of the tunnel oxide layer 8 and the silicon oxide layer 7. In TDDB examination evaluating of the rate of defective products when a current of 110 A/0.1 mm$^2$ is applied to the tunnel oxide layer 8 for six seconds, the rate of defective EEPROM product fabricated by the prior art process is 10%. However, in the present invention it becomes less than 1%. Further, upon applying a voltage between the select gate 5 and the silicon substrate 10 while the part of the silicon oxide layer 7 between them is destroyed, the rate of the products destroyed by applying a voltage less than 20 V is 20% in the prior art, whereas the embodiments of the present invention exhibit a decreased destruction rate which is less than 1%. This result shows clearly that the dielectric breakdown voltage of both of the tunnel oxide layer 8 and the silicon oxide layer 7 is increased.

As described above, the surface of the semiconductor where the tunnel part is formed is not exposed and not polluted because the silicon oxide layer 7 is not formed until after the silicon oxide layer 8 or the tunnel $Si_3N_4$ layer 9 is formed on the surface where the tunnel part is formed. As a result, the dielectric breakdown voltage of the tunnel oxide layer 8 is increased. It is also prevented that the silicon oxide layer 7 is contaminated by being placed in a diluted HF solution atmosphere during a HF process. Furthermore, phosphorus diffused into the polysilicon layer 3 cannot sink into the tunnel insulation layer 8 because the tunnel $Si_3N_4$ layer 9 is formed thereover. Therefore, the dielectric breakdown voltage of the tunnel oxide layer 8 is increased.

The insulation layer 9, in order to block impurities diffused into the polysilicon layer 3 from reaching the tunnel insulation layer 8 or surface of substrate where the tunnel insulation part is formed, is a material which is difficult to oxidize and which has a higher dielectric constant than $SiO_2$. For example, $Al_2O_3$ (Aluminum Oxide) and $TiO_2$ (Titanium Oxide) are also suitable in addition to $Si_3N_4$.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a semiconductor memory device, comprising the steps of:

forming a first insulation layer on a semiconductor substrate;

forming a second insulation layer on the first insulation layer;

removing the second insulation layer except for a tunnel insulation part where electrons formed in the substrate are enabled to pass through, without removing the first insulation layer in order to form an exposed first insulation layer;

forming a third insulation layer by oxidizing the exposed first insulation layer; and forming a polysilicon layer on the third and second insulation layers.

2. The method of claim 1, further comprising the step of:

diffusing an impurity into the polysilicon layer.

\* \* \* \* \*